United States Patent [19]

Tsuchiya et al.

[11] Patent Number: 5,633,205

[45] Date of Patent: May 27, 1997

[54] LEAD FRAME AND PROCESS OF PRODUCING SUCH A FRAME

[75] Inventors: Kenichiro Tsuchiya; Toshiaki Ishizaki; Masahiro Iwabuchi, all of Nagano, Japan

[73] Assignee: Shinko Electric Industries Co., Ltd., Nagano, Japan

[21] Appl. No.: 514,178

[22] Filed: Aug. 11, 1995

[30] Foreign Application Priority Data

Aug. 11, 1994 [JP] Japan .................... 6-189250

[51] Int. Cl.$^6$ ........................ H01L 21/60
[52] U.S. Cl. ............... 29/827; 216/14; 438/123
[58] Field of Search ............... 437/182, 209, 437/217, 220; 257/666, 669, 673; 29/827

[56] References Cited

U.S. PATENT DOCUMENTS

| | | | |
|---|---|---|---|
| 4,701,363 | 10/1987 | Barber | 29/827 |
| 4,711,700 | 12/1987 | Cusack | 29/827 |
| 4,733,292 | 3/1988 | Jarvis | 437/220 |
| 5,221,428 | 6/1993 | Ohsawa et al. | 29/827 |
| 5,230,144 | 7/1993 | Ootsuki | 437/220 |
| 5,253,415 | 10/1993 | Dennis | 29/827 |

FOREIGN PATENT DOCUMENTS

| | | |
|---|---|---|
| 56-169338 | 12/1981 | Japan . |
| 2-210854 | 8/1990 | Japan . |

*Primary Examiner*—Kevin Picardat
*Attorney, Agent, or Firm*—Staas & Halsey

[57] ABSTRACT

A lead frame includes a plurality of inner leads, each of the inner leads having at least one surface defining a bonding area and two opposed side edges. The tip ends of the plurality of inner leads are connected by a connecting part so that the inner leads are arranged side by side with respect to each other. The connecting part is integrally and simultaneously formed with the inner leads by an etching process. Each of the inner leads has recesses on the two side edges at a position, between the bonding area and the connecting part, on a cutting line along which the plurality of inner leads are to be cut and separated into individual inner leads.

5 Claims, 4 Drawing Sheets

1

LEAD FRAME AND PROCESS OF PRODUCING SUCH A FRAME

BACKGROUND OF THE INVENTION

1. Field of the Invention

This invention relates to a lead frame used for a semiconductor device and a process of producing such a lead frame.

2. Description of the Related Art

It is well known in the field of semiconductor devices that, because lead frames now include a large number of pins, it is necessary for finer inner leads and for shorter distances between these inner leads. In the prior art, a lead frame which includes a large number of such inner leads is usually formed by mechanical punching or chemical etching.

However, the inner leads of the lead frame formed by punching are not very fine and the distances between these inner leads cannot be as small as those formed by etching. Therefore, in many lead frames, the inner leads, and the like, are formed by etching so that the inner leads can be made fine and the distances between these inner leads can be made small.

However, if the inner leads are very fine and the distance between these inner leads is very small, the inner lead would more easily be deformed during the etching process and any subsequent process, such as a plating process.

The method for producing a lead frame known in the prior art, such as that described in Japanese Unexamined Patent Publication (Kokai) No. 2-210854, teaches that the tips of the inner leads are mutually connected by a connecting portion until certain processes (such as bending of the inner leads or the like) are carried out, and then the connecting portion is cut by punching. According to this method, it is possible to prevent the inner leads from being deformed until the processes are accomplished, even if such a lead frame is formed by etching.

However, a prior lead frame and a method of producing such frames, known in the prior art, have the following problems.

When a plurality of inner leads are formed by etching, so that the inner leads are arranged side by side to constitute a co-planar structure, each of the inner leads defines, in section, a trapezoid, which includes a lower side defined by a bonding surface and an upper side defined by a non-bonding surface, wherein the lower side is wider than the upper side. Since the distance between these inner leads is very small, burrs often remain after the inner leads are cut. These burrs may cause a connection between the adjacent inner leads and thus a short circuit therebetween.

SUMMARY OF THE INVENTION

Therefore, it is an object of the present invention to provide a lead frame, and a process for making such a lead frame, wherein generation of burrs during the separation of the tips of the inner leads, and a short circuit between inner leads, is prevented.

According to the present invention, there is provided a lead frame used in a semiconductor device comprising: a plurality of inner leads, each of said inner leads having a first surface defining a bonding area, a second surface opposed to said first surface and two opposed side surfaces; a connecting part connecting the tip ends of said plurality of inner leads so as to be arranged side by side with respect to each other, said connecting part being integrally formed with said inner leads by an etching process; and each of said inner leads having at least one recess on at least one of said two side surfaces at a position, between said bonding area and said connecting part, on a cutting line along which said plurality of inner leads are to be cut and separated into individual inner leads.

According to another aspect of the present invention, there is provided a process for making a lead frame used in a semiconductor device, comprising the steps of: etching a metal foil, having a first surface and a second surface opposed to said first surface, to form a lead frame body comprising a plurality of inner leads, each of said inner leads having at least one bonding area on said first surface and two opposed side surfaces, and a connecting part connecting the tip ends of said plurality of inner leads so as to be arranged side by side with respect to each other; forming at least one recess on at least one of said two side surfaces at a position, between said bonding area and said connecting part, on a cutting line, said recess forming step being simultaneously conducted with said etching step; and cutting said lead frame body along said cutting line to separate said plurality of inner leads into individual inner leads.

DESCRIPTION OF THE PREFERRED EMBODIMENTS

Figure 1:
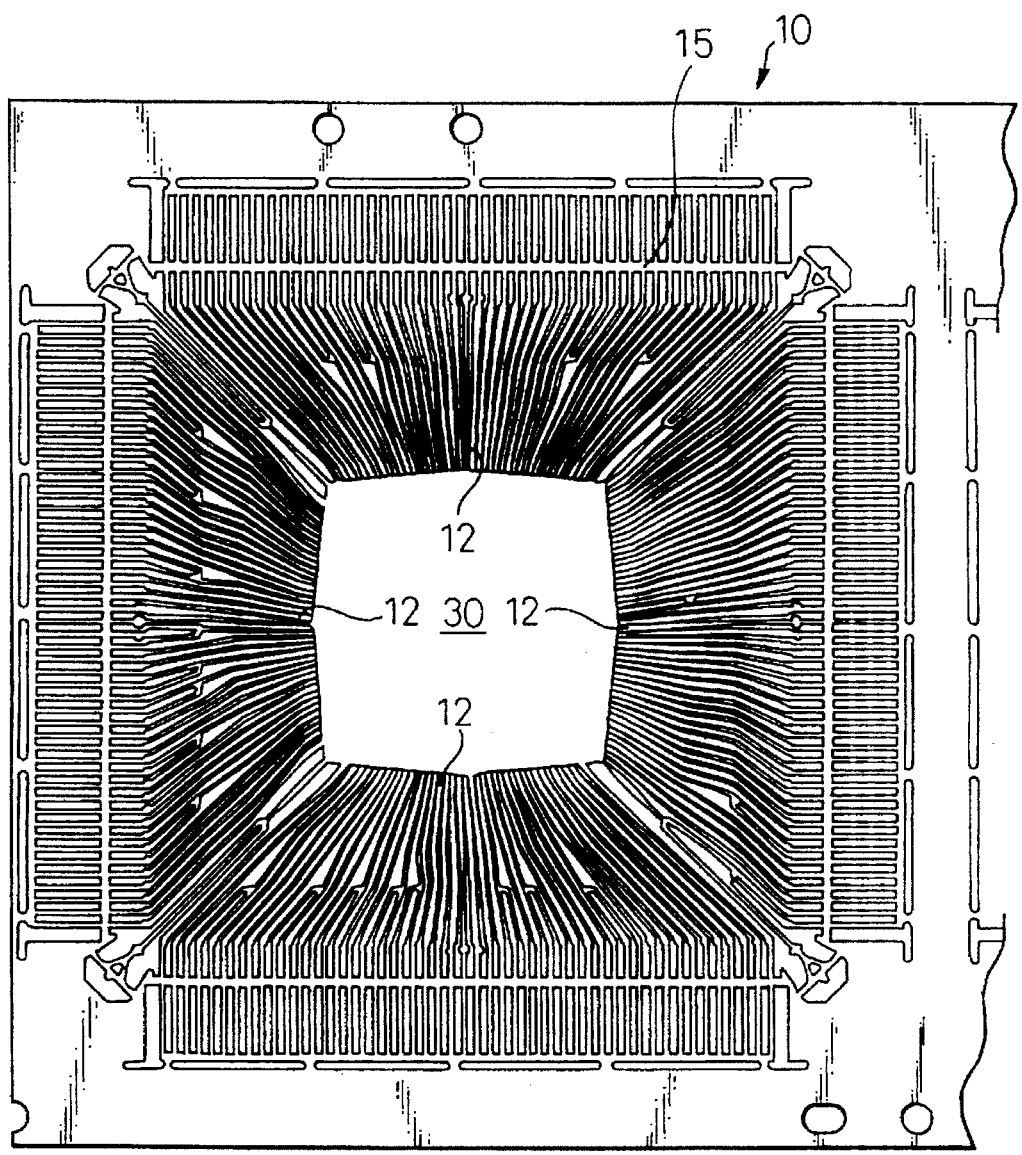
FIG. 1 is a plan view of a lead frame for producing a semiconductor device.

FIG. 1 is a plan view of a lead frame which is used for making a semiconductor device.

The lead frame 10 shown in FIG. 1 comprises a plurality of inner leads 12 arranged side by side with respect to each other and provided with a small distance between these inner leads. The tip ends of said plurality of inner leads 12 are connected to a die pad 30. The inner leads 12 are also connected by a dam-bar 15. Although this lead frame 10 includes the die-pad 30 as shown in FIG. 1, the present invention can also be applied to a lead frame which doesn't include such a die-pad.

Before explaining the preferred embodiments of this invention, a lead frame known in the prior art, such as Japanese Unexamined Patent Publication No. 2-210854 will be described with reference to FIG. 2.

Figure 2:
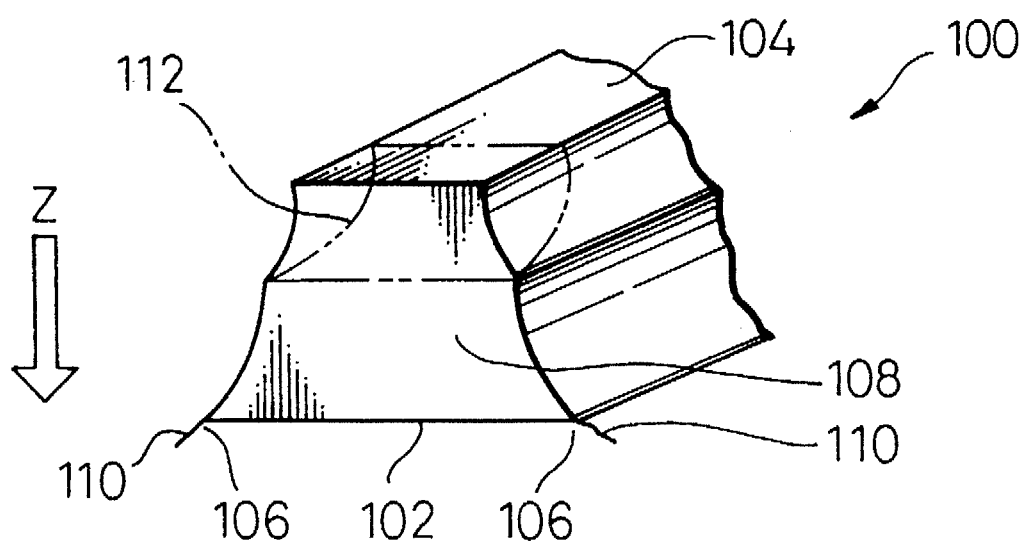
FIG. 2 is an enlarged fragmentary perspective view of one of the tips of the plurality of inner leads of the lead frame, known in the prior art.

FIG. 2 shows a tip of a inner lead 100 formed by etching. In FIG. 2, a wider lower surface of the inner lead 100 is a bonding surface 102. When a plurality of inner leads 100, which are arranged side by side to constitute a co-planar structure, are formed by etching, each inner lead, in section, substantially defines a trapezoid which includes a lower side defined by the bonding surface 102 and an upper defined by a non-bonding surface 104, in which the lower side is wider than the upper side. Such a trapezoid prevents an etching mask of the non-bonding surface 104 from getting out of the position in relation to that of the bonding surface 102, and any of the inner leads 100 are prevented from contacting with adjacent inner leads. When a connection part (not shown) is cut by a punching device, the inner leads 100 are commonly cut in a direction of Z (the cutting direction). Because the inner lead 100 shown in FIG. 1 is in the form of trapezoid, that is, the lower side is wider than the upper side, after the connection part is cut, several burrs 110 often remain at the corners 106 of a cutting surface 108. These burrs 110 may cause an electrical connection between one of the inner leads and an adjacent one, and cause a short circuit therebetween. In this case, that the inner leads are very fine and a distance therebetween is extremely small, it is time-consuming to examine whether burrs exist at tips of the inner leads or not. Moreover, this examination can be a factor in low rate of production. In particular, a soft metal (such as copper) can easily generate such burrs 110.

In addition, the prior art method discussed above has an upper groove 112 shown in FIG. 2, which allows the tip of the inner lead to be easily separated. However, in this case, a burr may easily be generated at a line where the cutting surface and the bonding surface cross. In order to prevent this burr, the clearance of the punching device must be small, so that the cost of the punching device becomes high. If the groove 112 is created on the side of the bonding surface 102, the bonding surface 102 cannot be formed in the vicinity of the tip of the inner lead 100. In addition, as the inner lead must be cut in a direction which is opposite to Z (in FIG. 2), the inner lead 100 may be twisted by pressure from the punching device.

Figure 3:
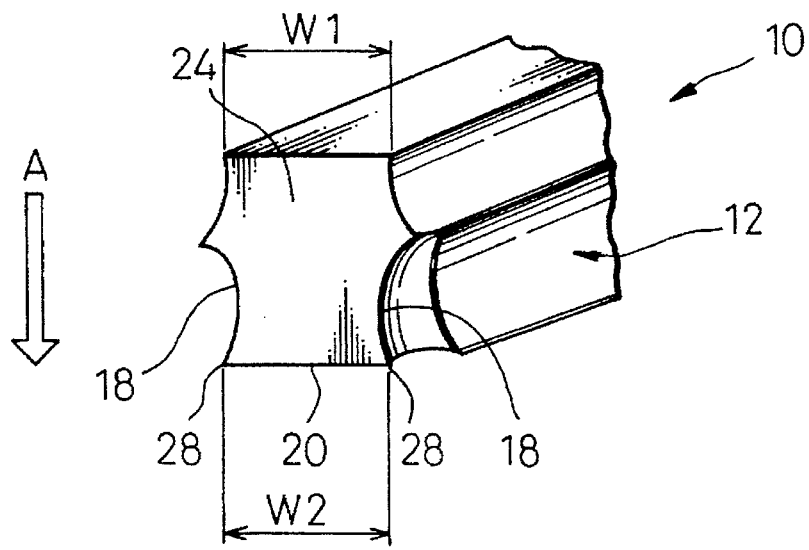
FIG. 3 is an enlarged fragmentary perspective view of one of the tips of the plurality of inner leads of the lead frame according to this invention.

FIG. 3 is an enlarged fragmentary perspective view of one of the tips of the plurality of inner leads of the lead frame 10 of this invention.

In this preferred embodiment, the inner lead 12 has an upper non-bonding surface 104, a lower bonding surface 20, a right side edge 28, a left side edge 28, and a recess 18 on each of the side edges 28. It is also possible that each of the inner leads 12 has only one recess on either of the left and right side edges 18 and 18. Furthermore, in this preferred embodiment, the right recess extends from the right side edge toward the left side edge and the left recess extends from the left side edge toward the right side edge, so that the width W1 of the upper surface is substantially the same as the width W2 of the lower surface, if measured along a cutting surface 24. This inner lead 12 also has a cutting surface 24, through which the tip end of the inner lead 12 had been connected to the connecting part (not shown) until the connecting part was cut. It is also possible that the inner lead 12 has an upper groove (not shown) in the same manner as the groove 112 in FIG. 2.

Figure 4:
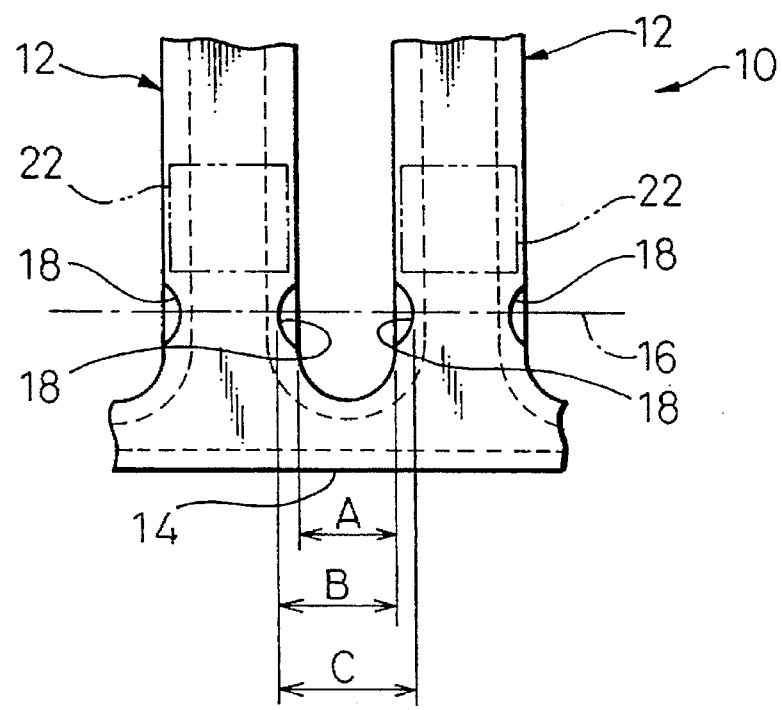
FIG. 4 is an enlarged fragmentary bottom plane view of a first embodiment of the inner leads of the lead frame of this invention.

FIG. 4 is an enlarged fragmentary bottom plane view of the inner leads of the lead frame.

The lead frame 10 shown in FIG. 4 is also provided with a connecting part (tie-bar) 14 which connects the tip ends of the plurality of inner leads 12 so as to be arranged side by side with respect to each other. The purpose of this connecting part 14 is to prevent the inner leads 12 from deforming during the plating process as mentioned below. The connecting part 14 is integrally formed with the plurality of inner leads 12, each of which includes two recesses 18 and 18 and a bonding area 22 on the bonding surface.

Furthermore, in this preferred embodiment, as seen in the plan view of FIG. 4, each of the recesses 18 has a form of half circle. However, it is also possible that a recess has a V-shaped configuration or any other shape. The recesses 18 are positioned between the bonding area 22 and the connecting part 14, and positioned on a cutting surface of line 16 along which said plurality of inner leads 12 are to be cut and separated into individual inner leads 12.

Furthermore, in this preferred embodiment, by forming such recesses 18, the distance A between the inner leads 18 is widened to a distance C. If each of the inner leads 12 has only one recess 18, as discussed above, the distance A is to be widened to a distance B.

The material of the lead frame may be copper, copper alloy, 42-alloy or the like.

In this preferred embodiment, a metal foil is etched from both of the first lower and second upper surfaces. However, it is also possible that the metal foil is etched from either the first surface or the second surface. It is preferred that, before the etching step, one or more etching resist patterns are formed on the metal foil, so that the part of the metal foil where it is not to be etched is protected by said pattern, and the other part of the metal foil, where is to be etched, such as an area of said recesses, is exposed.

Furthermore, in this preferred embodiment, after the etching step, such a lead frame is made by cutting the lead frame body along the cutting surface, on a line, to separate the individual inner leads. The cutting step is conducted by a known punching device (not shown) which comprises a die and a punch. It is preferred that, after the etching step and before the cutting step, the bonding area is plated with gold or silver.

As shown in FIG. 3, according to the lead frame of this preferred embodiment, because the recesses 18 are formed at the side of the lower surface of the inner lead 12, after a connection part (not shown) is cut by a punching device, several burrs in the form of mustache may be generated. However, such burrs are received within the recesses 18. Therefore, a short circuit which could be caused by the burrs is prevented.

Also, as shown in FIG. 3 and 4, although each of the recesses 18 and 18 are formed on the respective side edges, each bonding area 22 is not reduced, since the recesses 18 are positioned outside of the bonding area 22.

Figure 5:
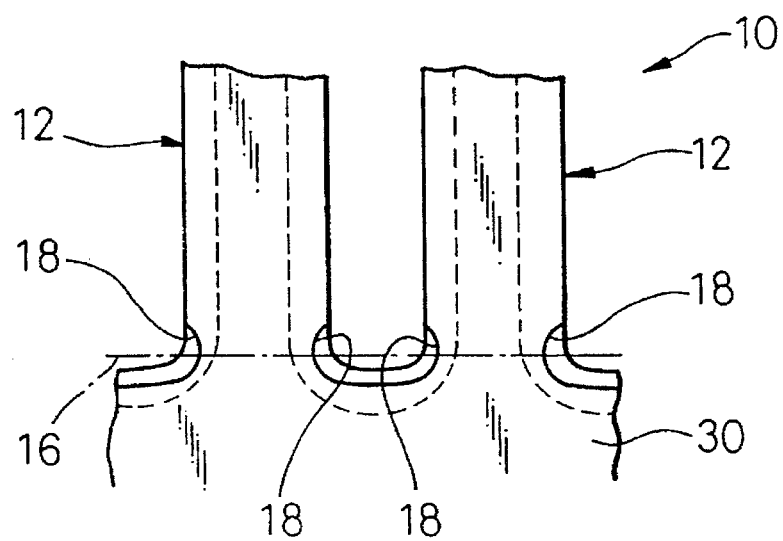
FIG. 5 is an enlarged fragmentary bottom plane view of a second embodiment of the inner leads of the lead frame of this invention.

FIG. 5 is an enlarged fragmentary bottom plane view of a second embodiment of a plurality of inner leads of a lead frame of this invention. The same parts as mentioned in said first embodiment are indicated by the same reference numerals and are not described hereafter.

In this preferred embodiment, a die-pad 30 is used in place of the connection part 14 of the first embodiment. The tip ends of the plurality of inner leads 12 are connected to the die-pad 30, so that the plurality of inner leads 12 are arranged side by side with respect to each other. Moreover, by a known etching process, the die-pad 30 is integrally formed with the inner leads 12. Each of the inner leads 12 has two recesses 18 at a position on a cutting line 16 along which the plurality of inner leads 12 are to be cut and separated into individual inner leads 12. It is possible that each of the inner leads 12 has only one recess 18.

Furthermore, in this preferred embodiment, although the shape of the recess 12 is different from that of the recess of the first embodiment, the advantage of the recess of this embodiment is as same as that of the first embodiment.

Furthermore, in this preferred embodiment, the die-pad 30 is cut along the cutting line 16, the die-pad 30 is removed in relation to the inner leads 12 toward the direction of the thickness of the lead frame (so called down-set process (depress process)), so that a space between the die-pad 30 and the inner leads 12 can be obtained.

Figure 6:
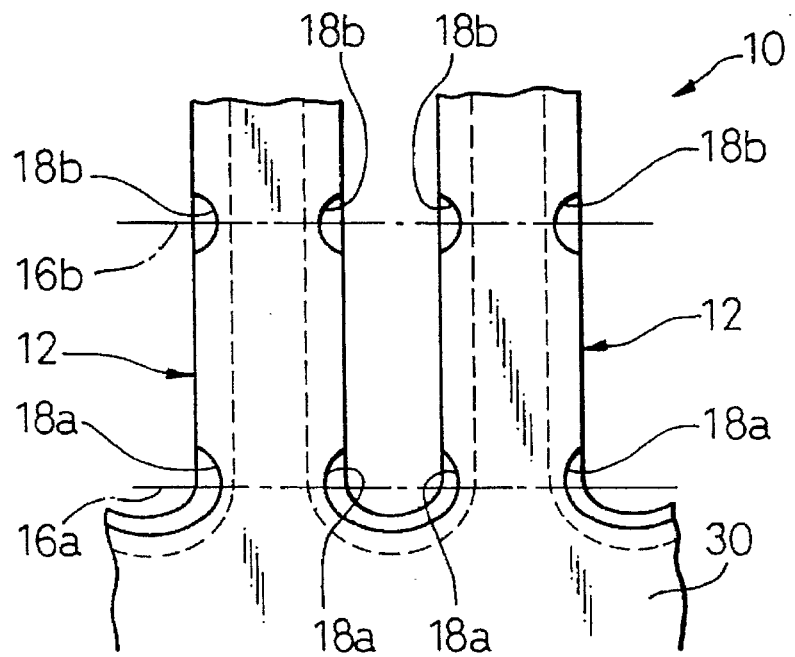
FIG. 6 is an enlarged fragmentary bottom plane view of a third embodiment of the inner leads of a lead frame of this invention.

FIG. 6 is an enlarged fragmentary bottom plane view of a third embodiment of a plurality of inner leads of a lead frame of this invention. The same parts as mentioned in the first and second embodiments are indicated by the same reference numerals and are not described hereafter.

In this preferred embodiment, a plurality of inner leads, which are connected to a die-pad 30, are to be cut and separated into individual inner leads along two cutting lines 16a and 16b. Each of the inner leads has two pair of recesses 18a and 18b, which are located at positions corresponding to the two cutting lines 16a and 16b. Thus, it is possible that each of the inner leads has more than one pair of recesses, along more than one cutting lines, and the inner leads are cut and separated into individual inner leads along these cutting lines.

Furthermore, in this preferred embodiment, the lead frame is cut simultaneously along all of the cutting lines.

Furthermore, in this third embodiment, after the cutting step along the cutting line 18a and 18b, a wider space, relatively to the space of the second embodiment, between the die-pad 30 and the inner leads 12 can be obtained, without removing the die-pad 30 nor the inner leads 12.

Although preferred embodiments and modifications of this invention have been described above with reference to the drawings, it should be understood that the scope of this invention is not limited to such embodiments or modifications, and that other modifications can be made by a person skilled in the art, within the scope or spirit of this invention as claimed in the attached claims.

We claim:

1. A process for making a lead frame used in a semiconductor device, comprising the steps of:

etching a metal foil, having a first surface and a second surface opposed to said first surface, to form a lead frame body comprising a plurality of inner leads, each of said inner leads having at least one bonding area on said first surface and two opposed side surfaces, and a connecting part connecting tip ends of said plurality of inner leads so as to be arranged side by side with respect to each other;

forming at least one recess, which reduces a width of the inner lead, on at least one of said two side surfaces at a position, between said boding area and said connecting part, on a cutting line, said recess forming step being simultaneously conducted with said etching step; and cutting said lead frame body along said cutting line to separate said plurality of the tips of the inner leads into individual inner leads.

2. A process as set forth in claim 1, wherein said metal foil is made of a metal such as copper, copper alloy, 42-alloy (iron-nickel alloy) or the like.

3. A process as set forth in claim 1 wherein, before said etching step, both of said first and second surfaces are coated with etching resist patterns, and said metal foil is etched from both of said first and second surfaces so as to form said inner leads each having a substantially trapezoidal cross-section, in such a manner that a first width of said first surface, on which said wire-bonding area is formed, is larger than a second width of said second surface and said recesses are provided on edges between said first surface and said two side surfaces, so that said first width of said first surface is substantially the same as said second width of said second surface, if measured along said line on which said recesses are provided.

4. A process, as set forth in claim 1, further comprising a step of plating said lead frame body with gold after said etching step and before said cutting step.

5. A process, as set forth in claim 2, wherein said recesses are formed, by etching, along two or more cutting lines and said inner leads are cut along said two or more cutting lines simultaneously.

\* \* \* \* \*